(12) United States Patent
Wu et al.

(10) Patent No.: US 10,809,422 B2
(45) Date of Patent: Oct. 20, 2020

(54) METHOD FOR MANUFACTURING ELECTRONIC DEVICE

(71) Applicant: InnoLux Corporation, Miao-Li County (TW)

(72) Inventors: Chi-Fang Wu, Miao-Li County (TW); Chin-Lung Ting, Miao-Li County (TW); I-Chang Liang, Miao-Li County (TW)

(73) Assignee: Innolux Corporation, Chu-Nan, Miao-Li County (TW)

(*) Notice: Subject to any disclaimer, the term of this patent is extended or adjusted under 35 U.S.C. 154(b) by 0 days.

(21) Appl. No.: 16/142,956

(22) Filed: Sep. 26, 2018

(65) Prior Publication Data

US 2020/0096673 A1 Mar. 26, 2020

(51) Int. Cl.
*G02B 1/14* (2015.01)
*G02B 5/30* (2006.01)

(52) U.S. Cl.
CPC .............. *G02B 1/14* (2015.01); *G02B 5/3025* (2013.01); *B32B 2457/202* (2013.01); *B32B 2457/206* (2013.01); *Y10T 156/108* (2015.01); *Y10T 156/1082* (2015.01)

(58) Field of Classification Search
CPC ... G02B 5/3025; G02B 1/14; Y10T 156/1052; Y10T 156/108; Y10T 156/1082; B32B 2457/202; B32B 2457/206
See application file for complete search history.

(56) References Cited

U.S. PATENT DOCUMENTS

| 8,673,104 B2 | 3/2014 | Lee | |
|---|---|---|---|
| 2005/0271835 A1* | 12/2005 | Kim | G02F 1/1333 428/1.62 |
| 2007/0188688 A1* | 8/2007 | Hwang | G02F 1/133351 349/122 |
| 2012/0261065 A1 | 10/2012 | Lee et al. | |

FOREIGN PATENT DOCUMENTS

| CN | 101486202 A | 7/2009 | |
|---|---|---|---|
| CN | 102200656 A | 9/2011 | |
| TW | 201407226 A | 2/2014 | |
| TW | 201642988 A | 12/2016 | |
| WO | WO-2014024867 A1 * | 2/2014 | ......... B23K 26/0846 |

* cited by examiner

*Primary Examiner* — Carson Gross (74) *Attorney, Agent, or Firm* — Muncy, Geissler, Olds & Lowe, P.C.

(57) ABSTRACT

A method for manufacturing an electronic device is disclosed, which includes the following steps: assembling a first mother substrate and a second mother substrate; disposing a first protection element on a surface of the first mother substrate away from the second mother substrate; disposing a first mother polarizer on the first protection element; and processing an assembly of the first mother substrate, the second mother substrate, the first protection element, and the first mother polarizer into a plurality of panels.

13 Claims, 5 Drawing Sheets

METHOD FOR MANUFACTURING ELECTRONIC DEVICE

BACKGROUND

1. Field

The present disclosure relates to a method for manufacturing an electronic device. More particularly, the present disclosure relates to a method for manufacturing an electronic device to decrease damage of a substrate of the electronic device.

2. Description of Related Art

In the current process for manufacturing the electronic devices, two mother substrates may be assembled, and the assembled two mother substrates are cut into a plurality of panels before the step of disposing the polarizers on the panels. However, when the assembled two mother substrates are cut into a plurality of smaller sized panels, because the number of the smaller sized panels are increased, more time has to be spent to dispose the polarizer on the panels. Therefore, the present disclosure provides a method for manufacturing an electronic device, wherein the method can reduce the above problems, or can increase the manufacturing yield of the electronic devices.

SUMMARY

The present relates to a method for manufacturing an electronic device, comprising the following steps: assembling a first mother substrate and a second mother substrate; disposing a first protection element on a surface of the first mother substrate away from the second mother substrate; disposing a first mother polarizer on the first protection element; and processing an assembly of the first substrate, the second mother substrate, the first protection element, and the first mother polarizer into a plurality of panels.

The present also relates to an electronic device, wherein the electronic device comprises a panel, and the panel comprises: a first substrate, a second substrate, a first protection element and a first polarizer. The second substrate is disposed opposite to the first substrate, the first protection element is disposed on a surface of the first substrate away from the second substrate, and the first polarizer is disposed on the first protection element.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. By the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Here, the terms "about" or "approximately" mean within 20%, 10% or 5% of a given value or range. The quantity given here is an approximate quantity, meaning that the meaning of "about" and "approximately" may be implied without specific explanation.

It is to be understood that the elements specifically described or illustrated may be in various forms well known to those skilled in the art. In addition, when a structure is "on" another structure or substrate, it may mean "directly" on another structure or substrate, or a structure on another structure or substrate, or between other structures or substrates.

In addition, the features in different embodiments of the present disclosure can be mixed to form another embodiment.

Figure 1:
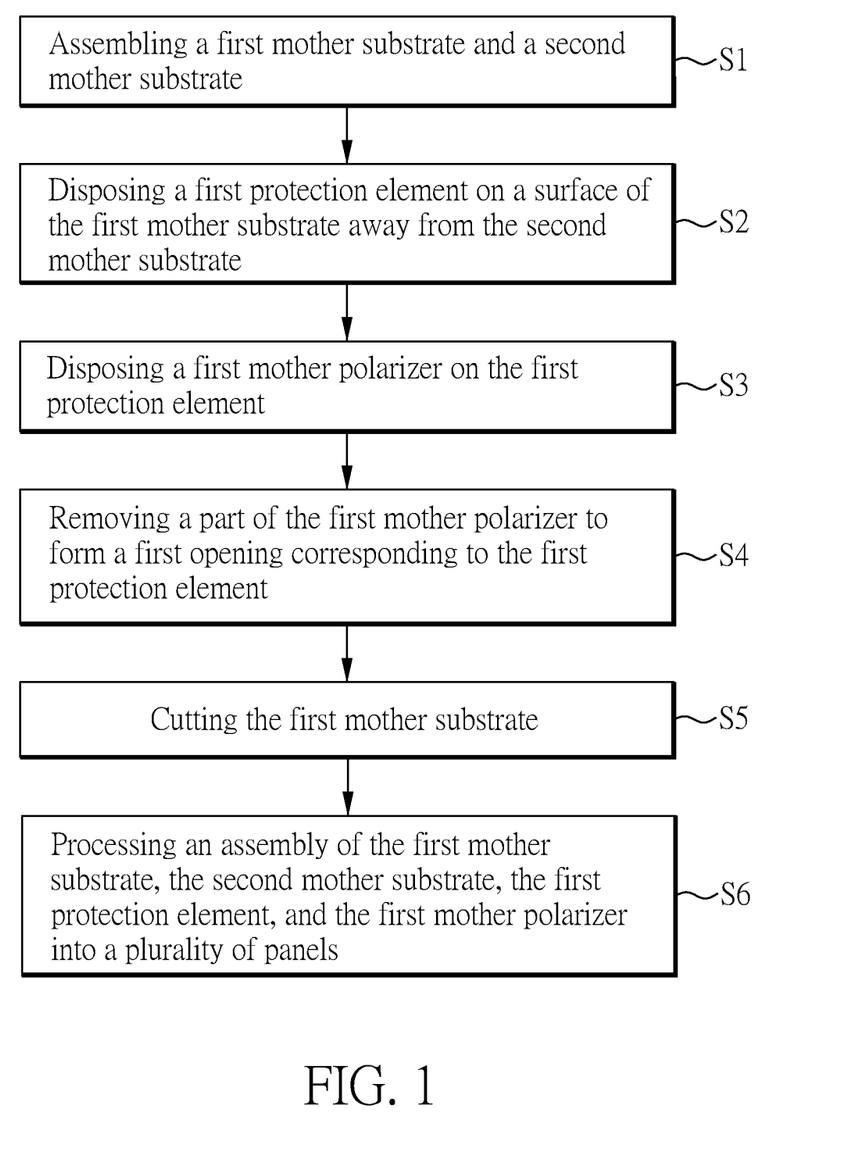
FIG. 1 is a flow chart showing a method for manufacturing an electronic device of the present disclosure.

FIG. 1 is a flow chart showing a method for manufacturing an electronic device of the present disclosure. The method at least comprises the following steps: (S1) assembling a first mother substrate and a second mother substrate; (S2) disposing a first protection element on a surface of the first mother substrate away from the second mother substrate; (S3) disposing a first mother polarizer on the first protection element; (S4) removing a part of the first mother polarizer to form a first opening corresponding to the first protection element; (S5) cutting the first mother substrate; and (S6) processing an assembly of the first mother substrate, the second mother substrate, the first protection element, and the first mother polarizer into a plurality of panels.

Hereinafter, the method for manufacturing an electronic device of the present disclosure shown in FIG. 1 is illustrated in detail in the following embodiments.

Embodiment 1

FIG. 2A to FIG. 2G are cross-sectional views showing a process for manufacturing an electronic device of the present embodiment.

Figure 2A:
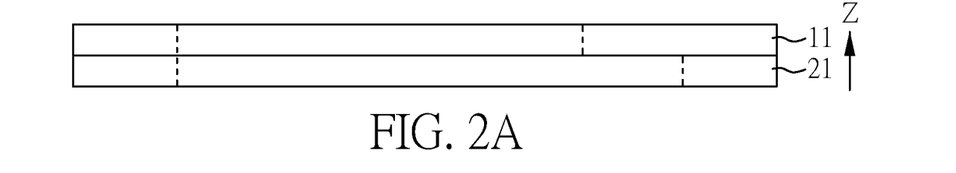
FIG. 2A to FIG. 2G are cross-sectional views showing a process for manufacturing an electronic device according to Embodiment 1 of the present disclosure.

As shown in FIG. 1 and FIG. 2A, in the step (S1), a first mother substrate 11 and a second mother substrate 21 are provided and assembled. It should be noted that, the assembled first mother substrate 11 and second mother substrate 21 can subsequently be cut for manufacturing a plurality of panels. The first mother substrate 11 or the second substrate 21 can correspond to a plurality of first substrates 11' (as shown in FIG. 2G) or a plurality of second substrates 21' (as shown in FIG. 2G) of panels. An electronic device can includes one panel. The material of the first mother substrate 11 or the second mother substrate 21 can include glass, quartz, organic polymer or metal, etc. Organic polymer may include polycarbonate (PC), polyimide (PI), polypropylene (PP), polyethylene terephthalate (PET) or other plastic or polymer material. But, the present disclosure is not limited thereto. The electronic device can include a liquid crystal (LC), an organic light-emitting diode (OLED), a quantum dot (QD), a quantum dot light-emitting diode (QLED), a fluorescent material, a phosphor material, a light-emitting diode (LED), a micro LED or a mini LED, but the present disclosure is not limited thereto. The electronic device can be a display device, a sensing device, an antenna device, or a lighting device, but the present disclosure is not limited thereto.

In one embodiment, the second mother substrate 21 can be an array substrate, and the first mother substrate 11 can be a color filter substrate. The array substrate can include transistors, drive circuit, wires, and/or electrodes, but the present disclosure is not limited thereto. The color filter substrate can include a color filter structure and a black matrix structure, but the present disclosure is not limited thereto. Alternatively, the color filter structure may be disposed on the second mother substrate 21 (such as array substrate), and the second mother substrate 21 is a color filter on array (COA) substrate. Alternatively, the black matrix structure may be disposed on the second mother substrate 21 (array substrate), and the second mother substrate 21 is a black matrix on array (BOA) substrate. In some embodiments, a seal, a spacer, or other components can be disposed between the first mother substrate 11 and the second mother substrate 21. A medium structure (not shown) can be disposed between the first mother substrate 11 and the second mother substrate 21, but the present disclosure is not limited thereto. In some embodiments, the electronic device can be a self-luminous electronic device, and the medium structure may include OLED, LED, mini-LED, micro-LEDs, or QLED or other suitable materials, but the present disclosure is not limited thereto. In some embodiments, one of the second mother substrate 21 and the first mother substrate 11 can be an array substrate, and the other one of the first mother substrate 11 and the second mother substrate 21 can be a cover substrate, but the present disclosure is not limited thereto.

In another embodiment, the electronic device may be a sensing device, and the sensing device includes sensing units disposed on the first mother substrate 11, on the second mother substrate 21 or between the first mother substrate 11 and the second mother substrate 21. The sensing unit includes a plurality of receiving units, a plurality of transmitting units or a plurality of sensors, but the present disclosure is not limited thereto.

In another embodiment, the electronic device may be an antenna device, and the antenna device includes a plurality of receiving units or a plurality of transmitting units, and the receiving unit or the transmitting units can be disposed on the first mother substrate 11, on the second mother substrate 21 or between the first mother substrate 11 and the second mother substrate 21. But, the present disclosure is not limited thereto.

Figure 2B:
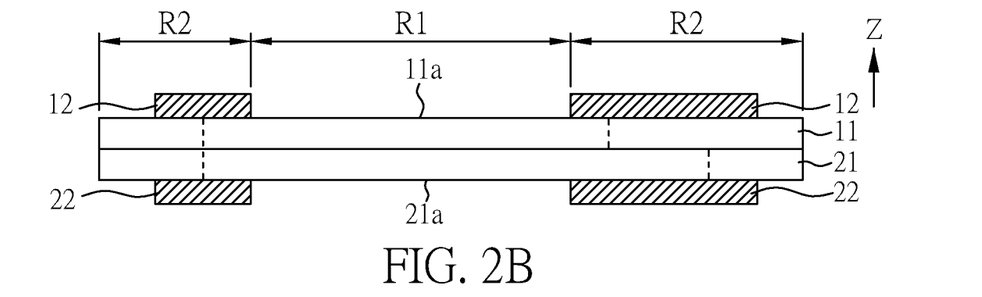

As shown in FIG. 1 and FIG. 2B, in the step (S2), a first protection element 12 is disposed on a surface 11a of the first mother substrate 11 away from the second mother substrate 21. In addition, a second protection element 22 is also disposed on a surface 21a of the second mother substrate 21 away from the first mother substrate 11. Herein, the first mother substrate 11 has an operating region R1 and a border region R2, and the first protection element 12 may be disposed corresponding to the border region R2. In some embodiment, the border region R2 may be adjacent to the operating region R1. In some embodiment, the operating region R1 may be surrounds by the border region R2. In some embodiment, the operating region R1 may include a display region, a detecting region, a sensing region or a lighting region, but the present disclosure is not limited thereto. The type of the operating region R1 depends on the type of the electronic device. In some embodiment, the border region R2 may include a non-display region, a non-detecting region, a non-sensing region or a non-lighting region, but the present disclosure is not limited thereto.

Figure 2C:
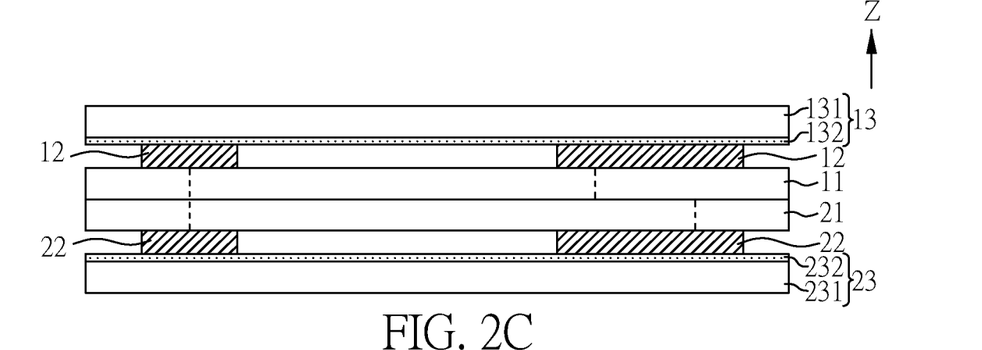

As shown in FIG. 1 and FIG. 2C, in the step (S3), a first mother polarizer 13 is disposed on the first protection element 12. In some embodiment, the first mother polarizer 13 comprises a first polarizing structure 131 and a first adhesive structure 132, and may optionally comprise other structures, such as a tri-acetate cellulose (TAC) layer; but the present disclosure is not limited thereto. In some embodiment, the TAC layer may be disposed between the first polarizing structure 131 and the first adhesive structure 132. In some embodiment, the first adhesive structure 132 may be disposed between the first polarizing structure 131 and the first protection element 12. In addition, a second mother polarizer 23 is disposed on the second protection element 22. The second mother polarizer 23 comprises a second polarizing structure 231 and a second adhesive structure 232, and may optionally comprise other structures, such as a TAC layer; but the present disclosure is not limited thereto. In some embodiment, the TAC layer may be disposed between the second polarizing structure 231 and the second adhesive structure 232. In some embodiment, the second adhesive structure 232 may be disposed between the second polarizing structure 231 and the second protection element 22. The first polarizing structure 131 or the second polarizing structure 231 may include polyvinyl alcohol (PVA), but the present disclosure is not limited thereto. It should be noted that, the first mother polarizer 13 or the second mother polarizer 23 can correspond to a plurality of first polarizers 13' (as shown in FIG. 2G) or a plurality of second polarizers 23' (as shown in FIG. 2G) of panels.

Figure 2D:
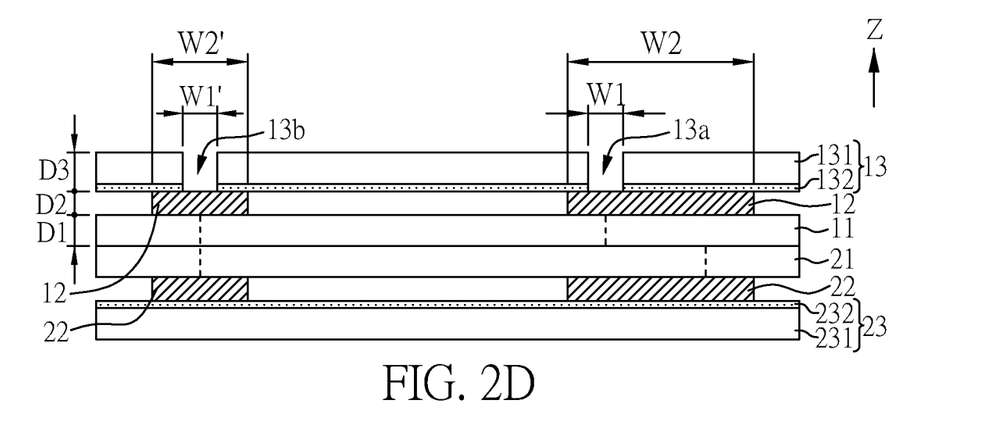

Then, as shown in FIG. 1 and FIG. 2D, in the step (S4), a part of the first mother polarizer 13 is removed to form first openings 13a, 13b corresponding to the first protection element 12. The positions of the first openings 13a, 13b may correspond to the positions of cutting sites (as indicated by the dot lines) of the first mother substrate 11. That is, the positions of the first openings 13a, 13b may be overlapped with the positions of the cutting sites and/or the first protection element 12 in a normal direction Z of the first mother substrate 11. Herein, the following step of forming second openings in the second mother polarizer 23 is described in advance. As shown in FIG. 2F, a part of the second mother polarizer 23 is removed to form second openings 23a, 23b corresponding to the second protection element 22. The positions of the second openings 23a, 23b may correspond to the positions of cutting sites (as indicated by the dot lines) of the second mother substrate 21. That is, the positions of the second openings 23a, 23b may be overlapped with the positions of the cutting sites and/or the second protection element 22 in a normal direction Z of the second mother substrate 21. It should be noted that, a contour of the first protection element 12 or the second protection element 22 may be rectangular, polygonal or irregular shape, or have other suitable shapes from a top view of the first mother substrate 11. In some embodiments, a contour of the first openings 13a, 13b and/or the second openings 23a, 23b may be rectangular, polygonal or irregular, or have other suitable shapes from a top view of the first mother substrate 11. In some embodiments, the contour of the first openings 13a, 13b and/or the second openings 23a, 23b may be similar or dissimilar to the contour of first protection element 12 or the second protection element 22.

Herein, the part of the first mother polarizer 13 or the part of the second mother polarizer 23 can be removed by a laser having wavelength ranged from 250 nm to 11000 nm (250 nm≤wavelength≤11000 nm) to form the first openings 13a, 13b or the second mother polarizer 23, but the present disclosure is not limited thereto. For example, the part of the first mother polarizer 13 can be removed by a $CO_2$ laser having wavelength ranged from 9400 nm to 10640 nm (9400 nm≤wavelength≤10640 nm), a green laser having wavelength about 533 nm, an UV laser having wavelength about 355 nm, or a deep UV (DUV) laser having wavelength about 266 nm, but the present disclosure is not limited thereto. The power of the used laser can be adjusted according to the type of the used laser, and can be ranged from 10 watt (W) to 200 W. For example, 200 W $CO_2$ laser or 10W DUV laser can be used to form the first openings 13a, 13b or the second openings 23a, 23b, and not limited thereto.

The thickness of the first protection element 12 can be in a range from 0.05 micrometer (μm) to 50 μm (0.05 μm≤thickness≤50 μm), but the present disclosure is not limited thereto. In some embodiments, the thickness of the first protection element 12 can be in a range from 0.05 μm to 30 μm (0.05 μm≤thickness≤30 μm). In some embodiments, the thickness of the first protection element 12 can be in a range from 0.05 μm to 15 μm (0.05 μm≤thickness≤15 μm). The material of the first protection element 12 is not particularly limited, as long as the first protection element 12 can reduce the damage of the first mother substrate 11 by laser, other removing methods or other cutting methods. For example, the first protection element 12 can have an absorptivity of laser in a range from 70% to 100% (70%≤absorptivity≤100%), but the present disclosure is not limited thereto. In some embodiments, the first protection element 12 can have an absorptivity of laser is in a range from 80% to 100% (80%≤absorptivity≤100%). In some embodiments, the first protection element 12 can have an absorptivity of laser is in a range from 90% to 100% (90%≤absorptivity≤100%). In some embodiments, the first protection element 12 can have a reflectivity of laser is in a range from 70% to 100% (70% reflectivity 100%), but the present disclosure is not limited thereto. In some embodiments, the first protection element 12 can have a reflectivity of laser is in a range from 80% to 100% (80%≤reflectivity≤100%). In some embodiments, the first protection element 12 can have a reflectivity of laser is in a range from 90% to 100% (90%≤reflectivity≤100%). The first protection element 12 may comprise polymer, metal, alloy or dielectric material, but the present disclosure is not limited thereto. For example, the first protection element 12 may include polyimide (PI), triacetate cellulose (TAC), cyclo-olefin polymer (COP), poly(methyl methacrylate) (PMMA), polycarbonate (PC), polyethylenterephthalate (PET), sealant, $SiO_2$, $Al_2O_3$, $TiO_2$, polytetrafluoroethylene (PTFE), Al, Al alloy, Ag, Ag alloy, Au, Au alloy, Cu, Cu alloy, Ti, Ti alloy, Ge, Mo, GaAs, ZnSe or other suitable material, but the present disclosure is not limited thereto. The material or characteristic of the second protection element 22 may be similar to that of the first protection element 12, so it will not be repeated. In one embodiment, the first protection element 12 and/or the second protection element 22 can be overlapped with the cutting site in the normal direction Z of the first mother substrate 11 and/or second mother substrate 21, respectively.

In some embodiment, when the first protection element 12 and/or the second protection element 22 is a transparent element, and the first protection element 12 and/or the second protection element 22 may be disposed on at least part of the surface 11a and/or at least part of the surface 21a. For example, the first protection element 12 and/or the second protection element 22 can be disposed on both the operation region R1 and the border region R2. The transparent element may include transparent dielectric structure or transparent conductive structure. The transparent conductive structure may include indium tin oxide (ITO), indium zinc oxide (IZO) or other suitable conductive materials, but the present disclosure is not limited thereto. In another embodiment, the first protection element 12 or the second protection element 22 may include PEDOT (Poly-3,4-Ethylenedioxythiophene), CNT (carbon nanotube), carbon mixture, silver nanowire, graphene, graphene oxide, other suitable materials or combinations thereof, but the present disclosure is not limited thereto.

Herein, the material of the first protection element 12 and/or the materials of the second protection element 22 can be selected according to the laser used for forming the first openings 13a, 13b and/or the second openings 23a, 23b. In one aspect of the present disclosure, when the first openings 13a, 13b and/or the second openings 23a, 23b are formed by using a $CO_2$ laser, a green laser, an UV laser or a DUV laser, and the materials of the first protection element 12 and/or the materials of the second protection element 22 can be a material with high absorptivity of laser, but the present disclosure is not limited thereto. The material with high absorptivity of laser may include PI, TAC, COP, PMMA, PC, PET, PTFE or sealant. In another aspect of the present disclosure, the first openings 13a, 13b and/or the second openings 23a, 23b are formed by using a nanosecond laser with a wavelength ranged about from 355 nm to 1060 nm, and the materials of the first protection element 12 and/or the materials of the second protection element 22 can be a material with high reflectivity of laser, but the present disclosure is not limited thereto. The material with high reflectivity of laser may include a metal (such as Al, Ag, Au, Cu, Ge, Ti or Mo), an alloy (such as Al alloy, Ag alloy, Au alloy, Cu alloy, Ge alloy, Ti alloy or Mo alloy) or a dielectric material (such as $SiO_2$, $Al_2O_3$, $TiO_2$, GaAs or ZnSe). In further another aspect of the present disclosure, the first openings 13a, 13b and/or the second openings 23a, 23b are formed by using a picosecond laser or a femtosecond laser, but the present disclosure is not limited thereto. All the materials illustrated above can be used as a material of the first protection element 12 and/or the second protection element 22, and the power or the time for applying the picosecond laser or the femtosecond laser can be adjusted to reduce damage of the first mother substrate 11 and/or the second mother substrate 21 of the electronic device.

As shown in FIG. 2D, after a part of the first mother polarizer 13 is removed and the first openings 13a, 13b corresponding to the first protection element 12 are formed, a part of a first adhesive structure 132 of the first mother polarizer 13 corresponding to the first openings 13a, 13b may further be removed if the first adhesive structure 132 still remain in the first openings 13a, 13b. Herein, the first adhesive structure 132 of the first mother polarizer 13 in the first openings 13a, 13b can be removed by a chemical treatment, a plasma treatment or a laser treatment, but the present disclosure is not limited thereto. The chemical treatment can be performed by using ethanol or acetone, but the present disclosure is not limited thereto. When the first adhesive structure 132 in the first openings 13a, 13b is removed by a laser treatment, this laser treatment can be the laser treatment performed in the following step of removing the first protection element 12 in the first openings 13a, 13b, but the present disclosure is not limited thereto. The laser treatment may be ablation, but the present disclosure not limited thereto.

In another embodiment of the present disclosure, if the first protection element 12 can be served as a release film (or a release element), the first adhesive structure 132 in the first openings 13a, 13b can be removed easily, so the step of removing the first adhesive structure 132 in the first openings 13a, 13b can bypass. The release film may include oxygenated resin, formaldehyde resin, platinum catalyst, isopropanol, toluene, methanol, isopropanol fluorine, fluorene compound, or other suitable material, but the present disclosure is not limited thereto.

In some embodiment, the first protection element 12 is overlapped with the first openings 13a, 13b in a normal direction Z of the first mother substrate 11. In addition, the first opening 13a has a first width W1, the first protection element 12 corresponding to the first opening 13a has a second width W2, and the second width W2 is equal to or greater than the first width W1. The first opening 13b has a first width W1', the first protection element 12 corresponding to the first opening 13b has a second width W2', and the second width W2' is equal to or greater than the first width W1'. Herein, the first width W1 or the first width W1' is defined as the maximum width of the first opening 13a or the first opening 13b in a direction perpendicular to an extension direction of the first opening 13a or the first opening 13b. The second width W2 or the second width W2' are defined as the maximum width of the first protection element 12 in a direction perpendicular to an extension direction of the first protection element 12. In detail, the first protection elements 12 or the second protection elements 22 may have different extension direction. In some embodiments, the first protection elements 12 or the second protection elements 22 may respectively correspond to or adjacent to different sides of the panel of the electronic device. In some embodiments, the first protection elements 12 or the second protection elements 22 can be continuous or separated.

The first openings 13a, 13b can respectively have the first widths W1, W1' in a range from 0.1 millimeter (mm) to 60 mm (0.1 mm≤W1 or W1'≤60 mm), but the present disclosure not limited thereto. In some embodiments, the first openings 13a, 13b can respectively have the first widths W1, W1' in a range from 0.1 mm to 40 mm (0.1 mm≤W1 or W1'≤40 mm). In some embodiments, the first openings 13a, 13b can respectively have the first widths W1, W1' in a range from 0.1 mm to 30 mm (0.1 mm≤W1 or W1'≤30 mm). The first widths W1, W1' of the first openings 13a, 13b can be adjusted according to the method used for cutting the first mother substrate 11 in the following steps.

If the first mother substrate 11 is cut by a nanosecond laser, a picosecond laser or a femtosecond laser, the first widths W1, W1' of the first openings 13a, 13b can be defined as follows. The first mother substrate 11 has a first thickness D1, the first protection element 12 has a second thickness D2, the first mother polarizer 13 has a third thickness D3, and the first opening 13a has the first width W1; wherein the first thickness D1, the second thickness D2, the third thickness D3 and the first width W1 satisfy the following equation:

$$(D3+D2+D1)/2 \leq W1.$$

The first thickness D1 is defined as a maximum thickness of the first mother substrate 11 corresponding to the first protection element 12 measured in the normal direction Z of the first mother substrate 11. The second thickness D2 is defined as a maximum thickness of the first protection element 12 measured in the normal direction Z of the first mother substrate 11. The third thickness D3 is defined as a maximum thickness of the first mother polarizer 13 corresponding to the first protection element 12 measured in the normal direction Z of the first mother substrate 11. In addition, the first width W1' of the first opening 13b can also be defined by the above equation by replacing the first width W1 of the first opening 13a with the first width W1' of the first opening 13b.

For example, when the first thickness D1 of the first mother substrate 11 is about 150 μm, the second thickness D2 of the first protection element 12 is about 1 μm, and the third thickness D3 of the first mother polarizer 13 is about 150 μm, the first widths W1, W1' of the first openings 13a, 13b can respectively be 150.5 μm. However, the present disclosure is not limited thereto.

If the first mother substrate 11 is cut by a $CO_2$ laser or a CO laser, the first widths W1, W1' of the first openings 13a, 13b can be in a range from 0.8 mm to 2 mm (0.8 mm≤W1 or W1'≤2 mm), but the present disclosure is not limited thereto.

If the first mother substrate 11 is cut by a cutting wheel, the first widths W1, W1' of the first openings 13a, 13b can be in a range from 0.8 mm to 10 mm (0.8 mm≤W1 or W1'≤10 mm), but the present disclosure is not limited thereto.

Figure 2E:
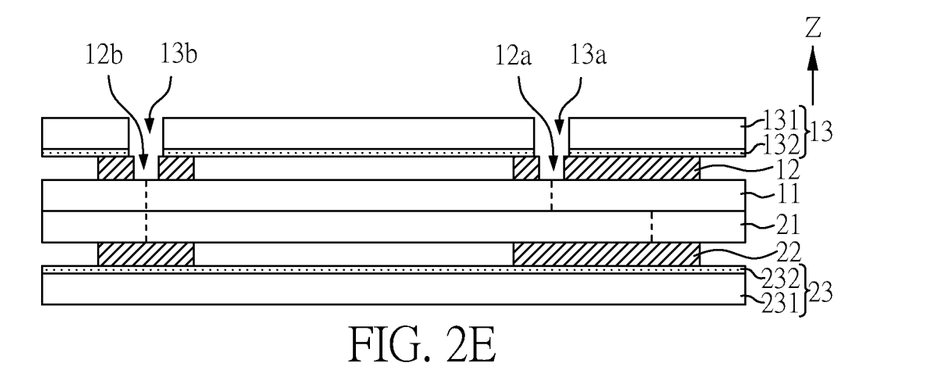
Figure 2F:
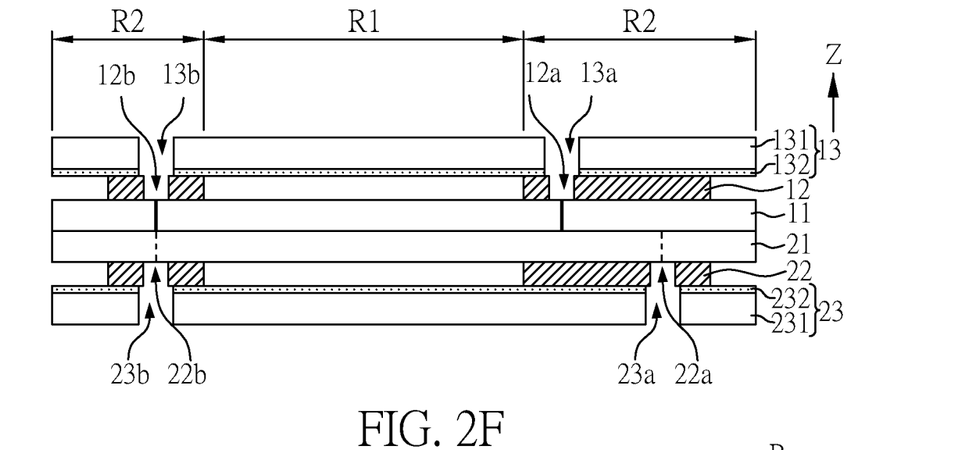
Figure 2G:
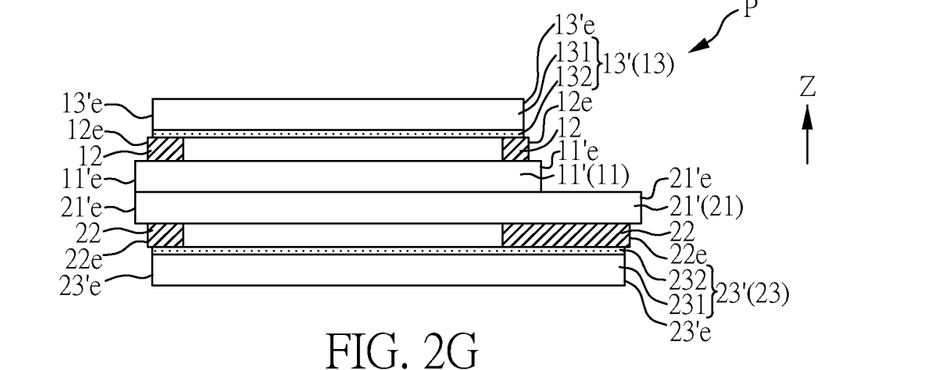

Then, as shown in FIG. 2E, a part of the first protection element 12 corresponding to the first openings 13a, 13b may be removed to form third openings 12a, 12b, and the third openings 12a, 12b may respectively correspond to the first openings 13a, 13b of the first mother polarizer 13. More specifically, at least part of the third openings 12a, 12b may be respectively overlapped with the first openings 13a, 13b in the normal direction Z of the first mother substrate 11. Herein, the first protection element 12 in the first openings 13a, 13b can be removed by an ablation process. The ablation process can be accomplished by, for example, a picosecond laser or a femtosecond laser, but the present disclosure is not limited thereto.

As shown in FIG. 1 and FIG. 2F, in the step (S5), the first mother substrate 11 is cut. More specifically, the first mother substrate 11 is cut according to the cutting sites (as indicated by the dot lines). Herein, the first mother substrate 11 can be cut by a laser, and the laser includes a nanosecond laser, a picosecond laser, a femtosecond laser, a $CO_2$ laser or a CO laser, but the present disclosure is not limited thereto.

As shown in FIG. 2F, a part of the second mother polarizer 23 is removed to form second openings 23a, 23b corresponding to the second protection element 22. The second adhesive structure 232 remaining in the second openings 23a, 23b is removed if it is necessary. The second protection element 22 in the second openings 23a, 23b is removed to form fourth openings 22a, 22b, the fourth openings 22a, 22b may respectively correspond to the second openings 23a, 23b of the second mother polarizer 23, and at least part of the fourth openings 22a, 22b may be respectively overlapped with the second openings 23a, 23b in the normal direction Z of the first mother substrate 11. Then, the second mother substrate 21 is cut. The methods for forming the second openings 23a, 23b and the fourth openings 22a, 22b are similar to the methods for forming the first openings 13a, 13b and the third openings 12a, 12b. The method for cutting the second mother substrate 21 is similar to the method for cutting the first mother substrate 11. The method for removing the second adhesive structure 232 is also similar to the method for removing the first adhesive structure 131. Thus, the descriptions thereof are not repeated again.

Finally, after removing a part of the first mother substrate 11 in the border region R2 and a part of the second mother substrate 21 in the border region R2, a panel of an electronic device of the present embodiment is obtained, as shown in FIG. 2G. As shown in FIG. 1, FIG. 2F and FIG. 2G in the step (S6), the assembly of the first mother substrate 11, the second mother substrate 21, the first protection element 12, and the first mother polarizer 13 is processed into a plurality of panels. In some embodiments, a part of the first protection element 12 is remaining in the electronic device. In some embodiments, a part of the second protection element 22 is remaining in the electronic device.

In other embodiments, we can add other steps or cancel some steps depending on demand. In other embodiments, we can adjust the order of the above steps depending on demand. For example, we can remove a part of the first mother polarizer 13 to form the first openings 13a, 13b, and remove a part of the second mother polarizer 23 to form the second openings 23a, 23b before the step of removing the part of the first protection element 12 in the first openings 13a, 13b to form third openings 12a, 12b, but the present disclosure is not limited thereto. In one embodiment, the first mother substrate 11 may be cut before the step of cutting the second mother substrate 21. In another embodiment, the second mother substrate 21 can be cut before the step of cutting the first mother substrate.

In the method for manufacturing an electronic device of the present embodiment, the first protection element 12 and/or the second protection element 22 is disposed before the step of disposing the first mother polarizer 13 and/or the second mother polarizer 23. During forming the first openings 13a, 13b of the first mother polarizer 13 or the second openings 23a, 23b of the second mother polarizer 23, the first protection element 12 or the second protection element 22 can respectively protect the first mother substrate 11 or the second mother substrate 21 from being damaged. Therefore, the yield of the electronic device of the present embodiment can be increased.

Embodiment 2

FIG. 3A to FIG. 3D are cross-sectional views showing a process for manufacturing an electronic device of the present embodiment. The process for manufacturing an electronic device is similar to those described in Embodiment 1, except for the following differences.

In Embodiment 1, the first mother substrate 11 and the second mother substrate 21 are cut by a laser. In the present embodiment, the first mother substrate 11 and the second mother substrate 21 are cut by a cutting wheel. Some steps performed in the present embodiment are similar to the steps shown in FIG. 2A to FIG. 2C, and these steps are not repeated again.

The widths of the first openings 13a, 13b and/or the second openings 23a, 23b in the present embodiment may be greater than the widths of the first openings 13a, 13b and/or the second openings 23a, 23b in Embodiment 1, but the present disclosure is not limited thereto.

Figure 3A:
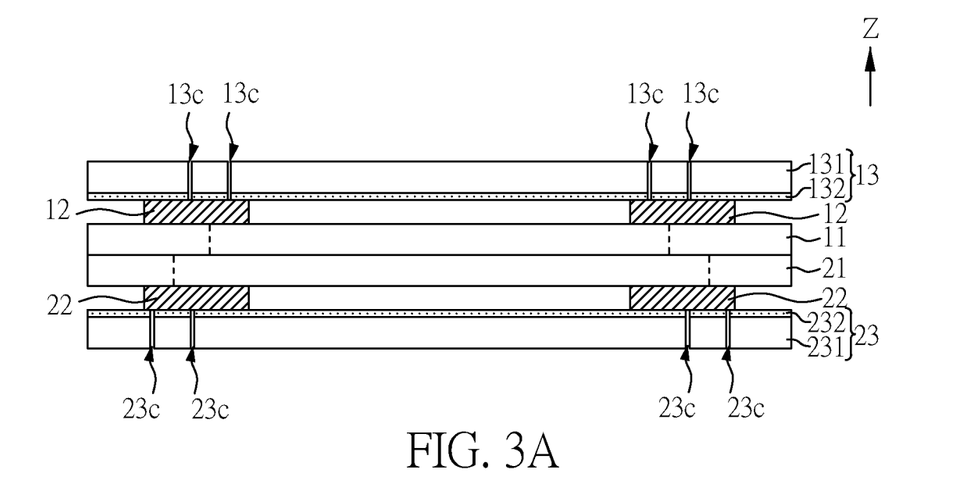
FIG. 3A to 3D are cross-sectional views showing a process for manufacturing an electronic device according to Embodiment 2 of the present disclosure.

In the present embodiment, as shown in FIG. 3A, the first slots 13c and/or the second slots 23c are formed in the first mother polarizer 13 and/or the second mother polarizer 23. The first slots 13c can define the edges of the first openings 13a, 13b. The second slots 23c can define the edges of the second openings 23a, 23b. Herein, the first slots 13c and/or the second slots 23c can be formed by a laser process, which is similar to the laser process for forming the first openings 13a, 13b and the second openings 23a, 23b described in Embodiment 1.

Figure 3B:
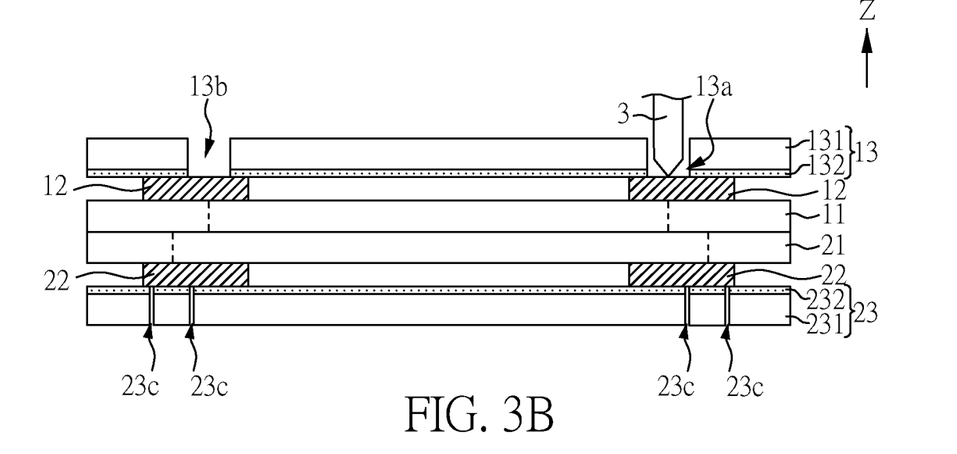

Next, as shown in FIG. 3B, a part of the first mother polarizer 13 is removed (such as peeled off) to form the first openings 13a, 13b corresponding to the first protection element 12. Additionally, the first adhesive structure 132 in the first openings 13a, 13b is removed if it is necessary. The method for removing the first adhesive structure 132 in the first openings 13a, 13b is similar to that illustrated in Embodiment 1. Then, a cutting wheel 3 is used to cut the first mother substrate 11.

Figure 3C:
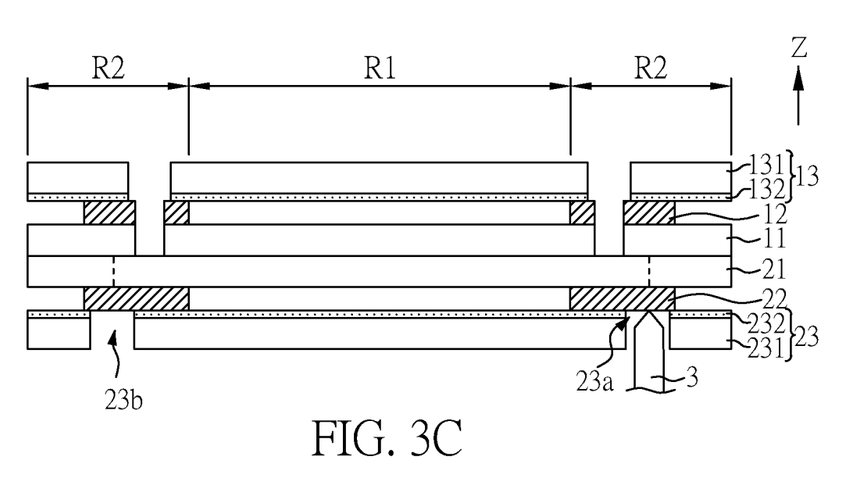

As shown in FIG. 3C, after the first mother substrate 11 is cut, a part of the second mother polarizer 23 is removed to form the second openings 23a, 23b corresponding to the second protection element 22. Additionally, the second adhesive structure 232 in the second openings 23a, 23b is removed if it is necessary. Then, a cutting wheel 3 is used to cut the second mother substrate 21.

Figure 3D:
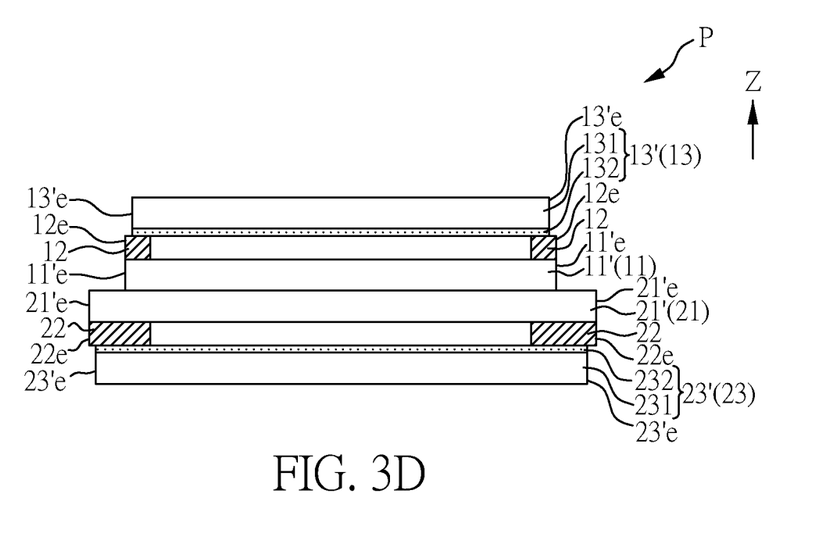

Finally, after removing a part of the first mother substrate 11 in the border region R2 and a part of the second mother substrate 21 in the border region R2, a panel of an electronic device of the present embodiment is obtained, as shown in FIG. 3D. In some embodiments, a part of first protection element 12 is remaining in the electronic device. In some embodiments, a part of second protection element 22 is remaining in electronic device.

In Embodiment 1 or Embodiment 2, the first mother substrate 11 is cut before the step of cutting the second mother substrate 21. In another embodiment, the second mother substrate 21 can be cut before the step of cutting the first mother substrate 11.

It should be noted that, as shown in FIG. 3B, when the first mother substrate 11 and the second mother substrate 21 are cut by the wheel cutter, the position of cutting sites (as indicated by the dot lines) of the second mother substrate 21 and the position of cutting sites (as indicated by the dot lines) of the first mother substrate 11 can be staggered. That is, the position of cutting sites of the second mother substrate 21 are not overlapped with the position of cutting sites of the first mother substrate 11 in the normal direction Z of the first mother substrate 11. In other words, when the second mother substrate 21 is cut, if the position of cutting sites of the second mother substrate 21 are not overlapped with a part of the first mother polarizer 13 or a part of the first mother substrate 11 in the normal direction Z of the first mother substrate 11, the position of cutting sites of the second mother substrate 21 are not be supported; so during the process of cutting the second mother substrate 21, an uneven cutting plane is easily caused, so the yield of the electronic device may be reduced. When the first mother substrate 11 is cut, if the position of cutting sites of the first mother substrate 11 are not overlapped with a part of the second mother polarizer 23 or a part of the second mother substrate 21 in the normal direction Z of the first mother substrate 11, the position of cutting sites of the first mother substrate 11 are not be supported; so during the process of cutting the first substrate 11, an uneven cutting plane is easily caused, so the yield of the electronic device may be reduced. Through the above method, we can reduce the above problems or increase the yield of the electronic device.

As shown in FIG. 2G and FIG. 3D, an electronic device can be provided, which comprises a panel P. The panel P comprises: a first substrate 11' (which is a part of the first mother substrate 11), a second substrate 21' (which is a part of the second mother substrate 21), a first protection element 12, a first polarizer 13' (which is a part of the first mother polarizer 13), a second protection element 22 and a second polarizer 23' (which a part of the second mother polarizer 23). The second substrate 21' is disposed opposite to the first substrate 11', the first protection element 12 is disposed on a surface of the first substrate 11' away from the second substrate 21', the first polarizer 13' is disposed on the first protection element 12, the second protection element 22 is disposed on a surface of the second substrate 21' away from the first substrate 11', and the second polarizer 23' is disposed on the second protection element 22. Thus, one of the obtained panels (i.e. the aforesaid electronic device) comprises a part of the second mother polarizer 23, a part of the first mother substrate 11, a part of the first protection element 12, a part of second protection element 22, a part of the first mother polarizer 13 and a part of the second mother polarizer 23.

In addition, the first polarizer 13' comprises a first polarizing structure 131 and a first adhesive structure 132, and the first adhesive structure 132 is disposed between the first polarizing structure 131 and the first protection element 12. The second polarizer 23' comprises a second polarizing structure 231 and a second adhesive structure 232, and the second adhesive structure 232 is disposed between the second polarizing structure 231 and the second protection element 22.

In some embodiments, the area of the second polarizer 23' may be equal to or greater than the area of the first polarizing 13' in the normal direction Z of the first substrate 11'. In some embodiments, the area of the area of the second substrate 21' may be equal to or greater than the area of the area of the first substrate 11' in the normal direction Z of the first substrate 11'. In some embodiment, the area of the first substrate 11' may be equal to or greater than the area of the first polarizing 13' in the normal direction Z of the first substrate 11'. In some embodiments, the area of the second substrate 21' may be equal to or greater than the area of the second polarizer 23' in the normal direction Z of the first substrate 11'.

In some embodiments, a distance between an edge 11'e of the first substrate 11' and an edge 12e of the first protection element 12 is in a range from 0 mm to 50 mm (0 mm≤distance≤50 mm), but the present disclosure is not limited thereto. In some embodiments, a distance between the edge 11'e of the first substrate 11' and the edge 12e of the first protection element 12 is in a range from 0 mm to 30 mm (0 mm≤distance≤30 mm). In some embodiments, a distance between an edge 21'e of the second substrate 21' and an edge 22e of the second protection element 22 is in a range from 0 mm to 50 mm (0 mm≤distance≤50 mm), but the present disclosure is not limited thereto. In some embodiment, a distance between the edge 21'e of the second substrate 21' and the edge 22e of the second protection element 22 is in a range from 0 mm to 30 mm (0 min≤distance≤30 mm). The distance between the edge 11'e of the first substrate 11' and the edge 12e of the first protection element 12 is defined by the maximum distance, and the edge 12e of the first protection element 12 is defined by the edge closest to the edge 11'e of the first substrate 11' (such as the lateral edge). The distance between the edge 21'e of the second substrate 21' and the edge 22e of the second protection element 22 is defined by the maximum distance, and the edge 22e of the second protection element 22 is defined by the edge closest to the edge 21'e of the second substrate 21' (such as the lateral edge). In some embodiments, the edge 12e of the first protection element 12 is located between an edge 13'e of the first polarizer 13' and the edge 11' e of the first substrate 11' in the normal direction Z of the panel P. In some embodiments, the edge 22e of the second protection element 22 is located between an edge 23'e of the second polarizer 23' and the edge 21'e of the second substrate 21' in the normal direction Z of the panel P. In some embodiments, an area of the first protection element 12 is different from an area of the second protection element 22. The area of the first protection element 12 is defined by a maximum area of the first protection element 12 in the normal direction Z of the panel P. The area of the second protection element 22 is defined by a maximum area of the second protection element 22 in the normal direction Z of the panel P. In some embodiments, a width of the first protection element 12 is different from a width of the second protection element 22. The width of the first protection element 12 is defined by a maximum width of the first protection element 12 in a direction perpendicular to an extension direction of the first protection element 12. The width of the second protection element 22 is defined by a maximum width of the second protection element 22 in a direction perpendicular to an extension direction of the second protection element 22. In some embodiments, the electronic device can be a self-luminous electronic device, and the self-luminous electronic device may include OLED, LED, mini-LED, micro-LEDs, or QLED or other suitable materials, but the present disclosure is not limited thereto. In some embodiments, the self-luminous electronic devices may not comprise the second polarizer 23' or the second protection element 22. For example, the first substrate 11' can be a cover substrate, and the second substrate 21' can be an array substrate, and the second polarizer 23' or the second protection element 22 is not required.

When the electronic device is a display device, the display device can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, tiled electronic devices, curvature electronic devices, free shaped electronic devices or other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A method for manufacturing an electronic device, comprising the following steps:
   assembling a first mother substrate and a second mother substrate;
   disposing a first protection element on a surface of the first mother substrate away from the second mother substrate;
   disposing a first mother polarizer on the first protection element; and
   processing an assembly of the first mother substrate, the second mother substrate, the first protection element, and the first mother polarizer into a plurality of panels, wherein the first mother substrate has an operating region and a border region, and the first protection element does not overlap the operating region.

2. The method of claim 1, wherein the first protection element is disposed corresponding to the border region.

3. The method of claim 1, wherein the first protection element has an absorptivity of laser in a range from 70% to 100%.

4. The method of claim 1, wherein the first protection element has a reflectivity of laser in a range from 70% to 100%.

5. The method of claim 1, further comprising a step of: removing a part of the first mother polarizer to form a first opening corresponding to the first protection element before the step of processing the assembly of the first mother substrate, the second mother substrate, the first protection element, and the first mother polarizer into the plurality of panels.

6. The method of claim 5, further comprising a step of: removing a part of a first adhesive structure of the first mother polarizer in the first opening after the step of removing the part of the first mother polarizer to form the first opening corresponding to the first protection element.

7. The method of claim 5, further comprising a step of: cutting the first mother substrate after the step of removing the part of the first mother polarizer to form the first opening corresponding to the first protection element.

8. The method of claim 7, further comprising a step of: removing a part of the first protection element corresponding to the first opening between the step of removing the part of the first mother polarizer to form the first opening corresponding to the first protection element and the step of cutting the first mother substrate.

9. The method of claim 5, wherein the first opening is overlapped with the first protection element in a normal direction of the first mother substrate.

10. The method of claim 5, wherein a first width of the first opening is in a range from 0.1 mm to 60 mm.

11. The method of claim 1, wherein a thickness of the first protection element is in a range from 0.05 µm to 50 µm.

12. The method of claim 1, wherein the first mother polarizer comprises a first polarizing structure and a first adhesive structure, and the first adhesive structure is located between the first polarizing structure and the first protection element after the first mother polarizer is disposed on the first protection element.

13. The method of claim 1, wherein one of the plurality of panels comprises a part of the second mother substrate, a part of the first mother substrate, a part of the first protection element and a part of the first mother polarizer, and a distance between an edge of the part of the first mother substrate and an edge of the part of the first protection element is in a range from 0 mm to 50 mm.

* * * * *